(12) United States Patent
Venkatram et al.

(10) Patent No.: US 10,923,164 B2
(45) Date of Patent: Feb. 16, 2021

(54) DUAL POWER I/O TRANSMITTER

(71) Applicant: Intel Corporation, Santa Clara, CA (US)

(72) Inventors: Hariprasath Venkatram, Hillsboro, OR (US); Mohammed G. Mostofa, Folsom, CA (US); Rajesh Inti, Hillsboro, OR (US); Roger K. Cheng, San Jose, CA (US); Aaron Martin, El Dorado, CA (US); Christopher Mozak, Portland, OR (US); Pavan Kumar Kappagantula, San Mateo, CA (US); Hsien-Pao Yang, Folsom, CA (US); Mozhgan Mansuri, Hillsboro, OR (US); James Jaussi, Hillsboro, OR (US); Harishankar Sridharan, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 101 days.

(21) Appl. No.: 16/147,634

(22) Filed: Sep. 29, 2018

(65) Prior Publication Data

US 2020/0105317 A1 Apr. 2, 2020

(51) Int. Cl.
*G11C 7/10* (2006.01)
*G06F 1/3234* (2019.01)
*G06F 13/16* (2006.01)

(52) U.S. Cl.
CPC .......... *G11C 7/1051* (2013.01); *G06F 1/3275* (2013.01); *G06F 13/1694* (2013.01); *G11C 7/1075* (2013.01)

(58) Field of Classification Search
CPC . G11C 7/1051; G11C 7/1075; G06F 13/1694; G06F 1/3275
See application file for complete search history.

(56) References Cited

U.S. PATENT DOCUMENTS

| | | | |
|---|---|---|---|
| 6,081,152 A * | 6/2000 | Maley | H03K 5/08 326/68 |
| 9,948,293 B1 | 4/2018 | Lau | |
| 2004/0227540 A1 * | 11/2004 | Correale, Jr. | H03K 3/356113 326/80 |

(Continued)

FOREIGN PATENT DOCUMENTS

WO 2015142436 9/2015

OTHER PUBLICATIONS

International Search Report & Written Opinion dated Oct. 23, 2019 for PCT Patent Application PCT/US2019/039976.

*Primary Examiner* — Daniel D Chang
(74) *Attorney, Agent, or Firm* — Green, Howard & Mughal LLP

(57) ABSTRACT

An apparatus is provided which comprises: a first power supply rail to provide a first power supply; second and third power supply rails to provide second and third power supplies, respectively, wherein a voltage level of the first power supply is higher than a voltage level of each of the second and third power supplies; a first driver circuitry coupled to the first power supply rail and the second power supply rail; a second driver circuitry coupled to the third power supply rail, and coupled to the first driver circuitry; and a stack of transistors of N conductivity type coupled to the first power supply rail, and to the second driver circuitry.

18 Claims, 11 Drawing Sheets

(56) References Cited

U.S. PATENT DOCUMENTS

2009/0102511 A1    4/2009   Hirose
2009/0168553 A1    7/2009   Kang
2013/0258782 A1   10/2013   Tatsumura et al.

* cited by examiner

DUAL POWER I/O TRANSMITTER

BACKGROUND

Next generations memory (DDR—Double Data Rate) technologies (e.g. LP4x, DDR5, LP5, etc.) have been purposed for lower area and lower power. The Input/Output (I/O) supply voltage is going down (e.g., to about 0.3V, 0.6 V, etc.) accordingly. With such low I/O voltage, traditional driver (e.g., p-type metal oxide semiconductor (PMOS) pull-up and n-type MOS (NMOS) pull-down) may not be used for area and power (even non-functional in some process node corners), e.g., as the PMOS pull-up may run into over-drive issue (e.g., $V_{gs}$ gets smaller). In addition, from reusability perspective, it is desirable to have combo transmitters to support both high voltage DDR4 (e.g., at a voltage level of about 1.2V or higher) and low voltage LP4x/LP5, DDR5 (e.g., at a voltage level of about 0.3V) using the same physical design (PHY). To comply with EoS (Electrostatic Overstress) using thin gate device at 1.2V supply, stacked devices are used, which makes over-drive issue of the PMOS pull-up even worse.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
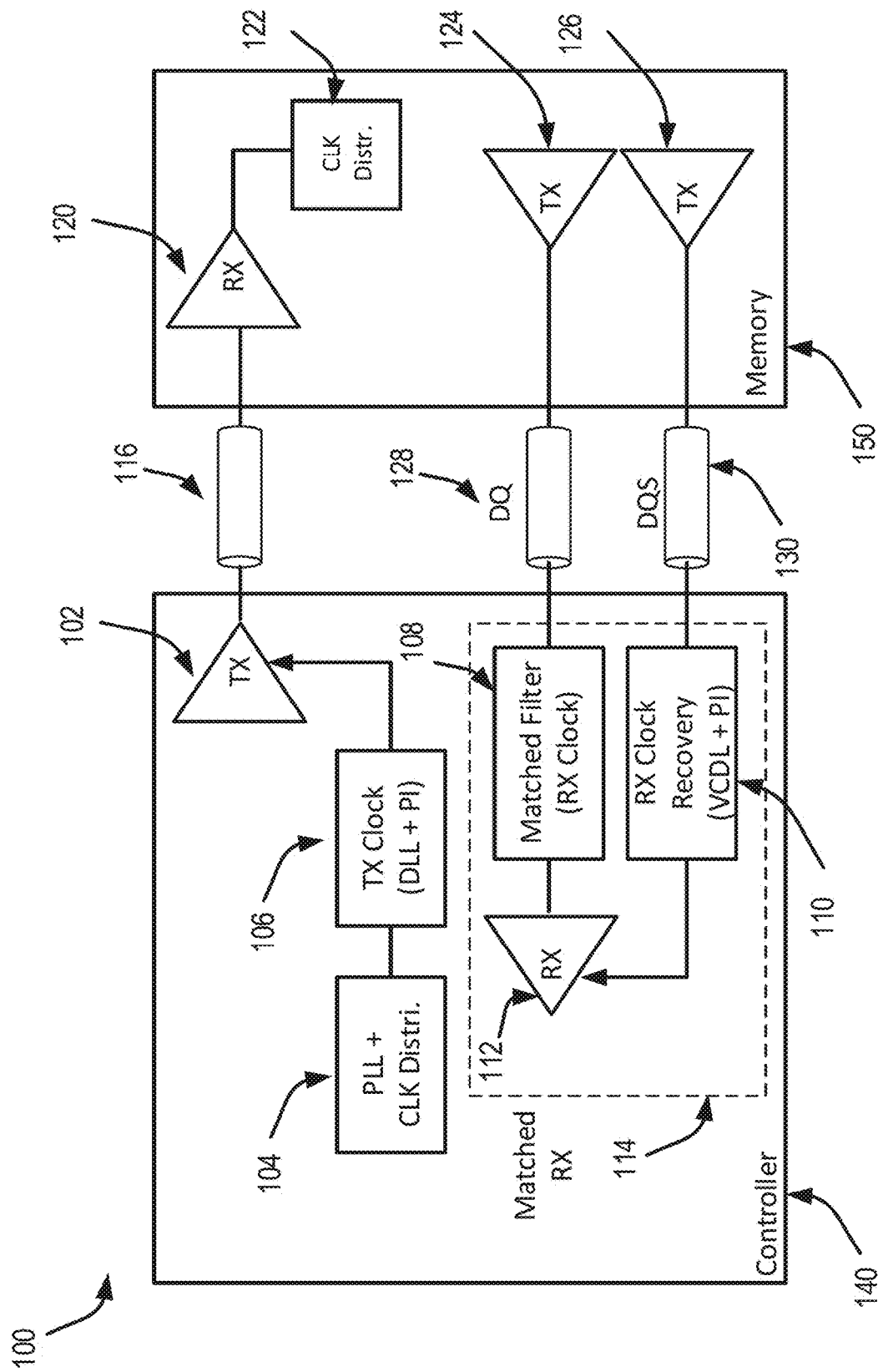
FIG. 1 illustrates a schematic of a Memory/Controller interface.

Current implementations of LPDDRx compliant transmitter output stage use a combination of device on-resistance (R_on) and resistance (e.g., approximately 25% device and approximately 75% resistor) to achieve the pull-up and pull-down impedance in the transmitter. Large devices are used to realize the 25% contribution to pull-up and pull-down impedances. These large devices result in increased capacitance on the input-output (I/O) pad coupled to the transmitter output stage. The increased pad capacitance limits the maximum operable data-rate of the transmitter (note, current LPDDRx products operate up to 3.2 Giga-bits per second (Gb/s)). Furthermore, it is desirable that the LPDDRx configurations of the transmitter output stage (e.g., for client segment) operate over a wide range of power supply voltages (e.g., $V_{ddq}$ between about 0.3V to about 0.7V). Implementations using n-over-n device transmit topology offer relatively high output swing, relatively low power dissipation, and relatively high linearity, e.g., merely at lower supply voltages (e.g., 0.3V), but have limited voltage swing at higher supply voltages and poor slew rate during pull-up operation. To meet the target voltage swing and slew rate specifications, these circuit topologies rely on increasing pre-driver supply voltage to achieve higher output voltage swing, but this leads to increased power dissipation.

Some embodiments of the current disclosure implement dual power a device-only transmitter to minimize area, pad capacitance and enable operation of the interface at higher frequencies (e.g., 10 Gb/s or more). The embodiments meet the target swings without having to use an elevated pre-driver supply voltage when the output stage of the transmitter is operating at a higher power supply voltage $V_{ddq}$, thereby reducing power dissipation. The embodiments also improve slew rate during pull-up (e.g., during the output driver data transition from logic low to logic high).

Some embodiments of the disclosure comprise NMOS transistor(s) in the pull-up driver, which solves the issues of supporting low I/O supply voltage. The gate voltage of the NMOS pull-up driver is driven by HV (high voltage), which improves the VOH (output high voltage) range and improves the linearity of the NMOS pull-up driver as overdrive gets higher. In addition, the NMOS pull-up driver size is reduced to meet the same VOH range, which improves area and pad capacitance.

Some embodiments of the disclosure comprise a pn-over-n device circuit topology. The pn-over-n topology refers to a transistor stack with both P-type and N-type transistors in the upper stack coupled to the supply rail, and merely N-type transistors in the lower stack coupled to the ground. This circuit topology is unlike the n-over-n topology with device and resistor implementations. The n-over-n topology refers to a transistor stack with merely N-type transistors in the upper stack connected to the supply rail, and merely N-type transistor in the lower stack coupled to the ground. The pn-over-n device topology assists with lowering the pad parasitic capacitance. The pn-over-n device topology also helps with meeting target output voltage swing and slew rate specifications over a wide range of output stage supply voltage (e.g., from substantially 0.3 to substantially 0.7V), while offering an extremely area-efficient solution.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

The terms "left," "right," "front," "back," "top," and "bottom" and the like in the description and in the claims, if any, are used for descriptive purposes and not necessarily for describing permanent relative positions.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The term "between" may be employed in the context of the z-axis, x-axis or y-axis of a device. A material that is between two other materials may be in contact with one or both of those materials, or it may be separated from both of the other two materials by one or more intervening materials. A material that is between two other materials may be in contact with one or both of those materials, or it may be separated from both of the other two materials by one or more intervening materials, either temporally, spatially, in ranking or connected to one or both of those devices, or it may be separated from both of the other two devices by one or more intervening devices.

It is pointed out that those elements of the figures having the same reference numbers (or names) as the elements of any other figure can operate or function in any manner similar to that described, but are not limited to such.

FIG. 1 illustrates a schematic 100 of a Memory/Controller interface. Controller interface 140 comprises a transmitter block, which includes: a Transmit circuitry 102, a Phase Locked Loop (PLL) and Clock Distribution circuitry 104, a transmitter (TX) clock circuitry 106 (e.g., which comprises a Delay Locked Loop (DLL) and Phase Integrator (PI) TX). The controller 140 also comprises a receiver circuitry 114. FIG. 1 illustrates a Matched Receiver circuitry 114, comprising a Matched Filter 108, an Rx Clock recovery 110; and an RX receiver circuitry 112. The Rx Clock circuitry 110 extracts the clock signal from the received data stream through data output strobe DQS 130, and comprises a Voltage Controlled Delay Line (VCDL) and a Phase Integrator (PI). VCDL adds a amount of sample delay to its input signal. For example, the VCDL receives the data output strobe DQS 130, adjusts a phase of a sampling clock of the data output strobe DQS 130. The PI allows the Rx Clock recovery circuitry 110 to adjust the phase of the sampling clock in relatively fine increments. The Matched Filter 108 operates such that a delay on data output DQ 128 matches at least a minimum delay of data output strobe DQS 130. The RX receiver 112 extracts the data from the data stream output of the Matched Filter 108.

The Memory interface 150 comprises an RX receiver 120, which is coupled to a Clock Distributor 122. The Memory interface 150 also comprises Transmitters 124 and 126, which transmit data signals on lines data output (DQ) 128 and data output strobe (DQS) 130, respectively.

Although FIG. 1 illustrates an example, schematic 100 includes example implementations of the controller interface 140 and the memory interface 150, any appropriate variations of the controller interface 140 and the memory interface 150 may be possible. Some embodiments of the present disclosure relate to the memory controller transmitter 102, although some other embodiments of the present disclosure may relate to any other appropriate type of transmitter as well.

During previous generation of DDR technologies with higher I/O supply voltage (e.g. DDR1=2.5V, DDR2=1.8V, DDR3=1.5V, DDR4=1.2V, etc.), memory controller transmitters with PMOS pull-up and NMOS pull-down drivers were working well. However, with the next generation DDR technologies (e.g. LP4x, LP5, DDR5) with low I/O supply voltage (e.g., 0.3V) and the requirement of having combo transmitter supporting both DDR4 (1.2V) and LP4x, LP5, DDR5 (to 0.3V) with stacked thin gate transistors, the PMOS pull-up driver is running into operational issues with I/O supply voltage at 0.6V or lower. As I/O supply voltage goes down, source voltage of the pull-up PMOS driver goes down, so does overdrive voltage (e.g., $V_{gs}-V_t$) and the PMOS transistors becomes non-functional specifically at slow process corner nodes.

Figure 2:
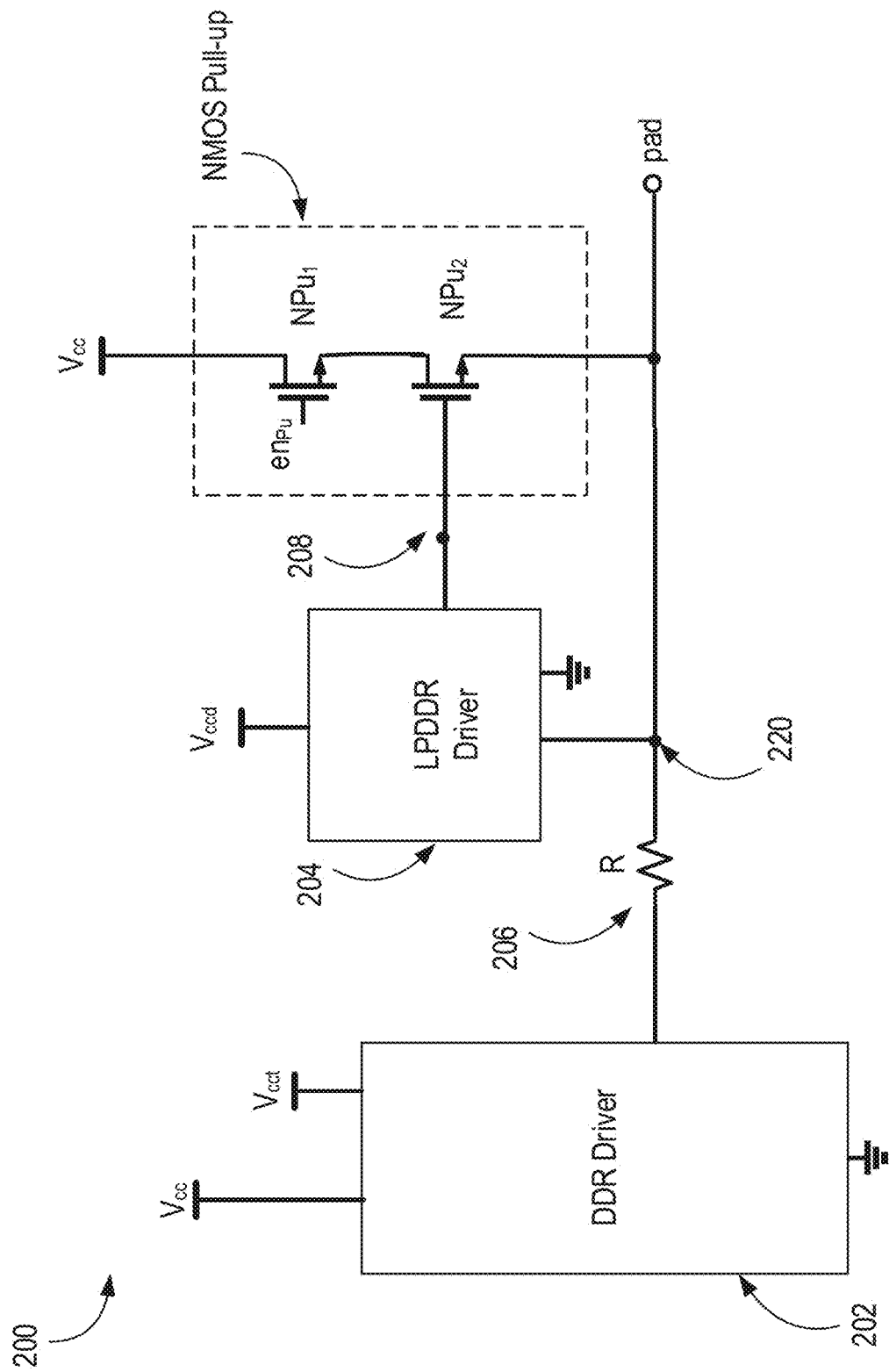
FIG. 2 illustrates a schematic of a memory controller transmitter with stacked P over N design, according to some embodiments of the current invention.

FIG. 2 illustrates a schematic of a memory controller transmitter 200 (also referred to as transmitter 200, or a combo transmitter 200) with stacked p-over-n design, according to some embodiments of the disclosure. The p-over-n design refers to a transistor stack with P-type transistors in the upper stack coupled to the supply rail, and N-type transistors in the lower stack connected to the ground. In some embodiments, the combo transmitter 200 comprises a stacked p-over-n design. In some embodiments, the combo transmitter 200 also comprises a stacked NMOS pull-up driver e.g., for low-swing applications. The combo transmitter 200 of various embodiments solves the low voltage functional issue (e.g. seen by current LP4x, DDR5, LP5, based drivers etc.) by having an NMOS at the pull-up coupled to a low voltage power supply.

Traditionally (e.g., for relatively higher values of supply voltage, such as at least as high as 1.0 V), P-type transistors are used for pull-up. This is because, for a relatively low drive voltage, N-type pull-up transistors may not be fully switched on. Using an N-type pull-up transistor may result in the voltage swing at the output node to be in the millivolt range, which is generally not sufficient for traditional transmitters.

However, as the supply voltage becomes relatively low (e.g., at 0.7 V, or even lower), an N-type pull-up transistor may be switched on during the pull-up operation. The N-type pull-up transistor may cause a voltage swing in the range of hundreds of millivolts (mV), e.g., in the range of about 150 mV to about 300 mV. Such a low voltage swing may be sufficient for modern transmitters and receivers, such as transmitters and receivers used for newer generation memory like LP4x DDR, LP5 DDR, DDR5, etc.

Thus, for example, having an NMOS at the pull-up enables the combo transmitter 200 to operate at a low voltage supply (e.g., lower than 0.7 V), which allows the combo transmitter 200 to be used for low voltage memory applications, such as LP4x, LP5 memories, or other low voltage memory applications.

This low voltage driver supply (e.g., substantially 0.5V or lower) may be shared with a memory (e.g. DRAM) driver as well. For memory technologies using a higher voltage (e.g. substantially 1.2V for DDR4), a PMOS pull-up stack may be used.

In some embodiments, the memory controller transmitter 200 comprises a first power supply rail $V_{cc}$; a second power supply rail $V_{cct}$, and a third power supply rail $V_{ccd}$. In some embodiments, the first power supply $V_{cc}$ is higher than each of the second power supply $V_{cct}$ and third power supply $V_{ccd}$. In some embodiments, the memory controller transmitter 200 comprises a DDR driver circuitry 202 coupled to the first power supply rail $V_{cc}$ and the second power supply rail $V_{cct}$. In some embodiments, the memory controller transmitter 200 comprises a second LPDDR driver circuitry 204 coupled to the third power supply rail $V_{ccd}$.

In some embodiments, the LPDDR driver circuitry 204 is coupled to the first DDR driver circuitry 202 via a resistive device 206 (e.g., which may comprise a resistor, or any other appropriate resistive device). While in an example the resistive device 206 (or any other resistive device or resistor illustrated in other figures) can be a resistor, in other examples, the resistive device 206 may be a transistor operating in an active region, a passive resistor offered by a process node (e.g., a poly resistor), a thin film resistor, devices made on front-end (e.g., active regions up to lower level metal layers such as Metal 3) of a die, devices made on a backend (upper level metal layers such as M4 and higher) of a die, off-chip resistive device, on-die resistive device, resistive devices formed in a substrate of a package, and/or the like.

In some embodiments, the memory controller transmitter 200 comprises a stack of transistors of N conductivity type ($NPu_1$, $NPu_2$), coupled to the first power supply rail $V_{cc}$. In some embodiments, the stack of transistors of N conductivity type ($NPu_1$, $NPu_2$) is coupled to the LPDDR driver circuitry (junctions 208, and 220). In some embodiments, the stack of transistors comprises two N conductivity type transistors $NPu_1$, $NPu_2$. In some embodiments, the input gate terminal of transistor $NPu_1$ is coupled to an enable input ($en_{Pu}$), and the gate terminal of transistor $NPu_2$ is coupled to the LPDDR driver circuitry (junction 208).

With the NMOS pull-up driver comprising n-type transistors $NP_{u1}$ and $NP_{u2}$ of some embodiments, the output waveform at a pad (e.g., which is at an output of the transmitter 200) is functional at I/O supply voltages all the way down to substantially 0.3V, for example. In some embodiments, having an NMOS in the pull-up driver makes the output at the pad less sensitive to the I/O supply voltage variations. As the source of the NMOS pull-up driver is connected to the pad and by looking at the source (pad) of a small signal model of a MOSFET, the pull-up path acts as constant current source ($gmV_{gs}$). This current source is a strong function of $V_{gs}$ and the pad voltage becomes a weak function of $V_{ds}$ ($R_{ds}$). Therefore, the output high voltage VOH will be in the range of smaller $V_{ga}-V_t$ and not greater than the I/O supply voltage. Furthermore, VOH is a strong function of $V_{gs}-V_t$ and to improve the VOH, in some embodiments, the gate voltage is connected to high voltage (e.g., 1.2V) instead of low voltage (e.g., 0.85V).

Figure 3:
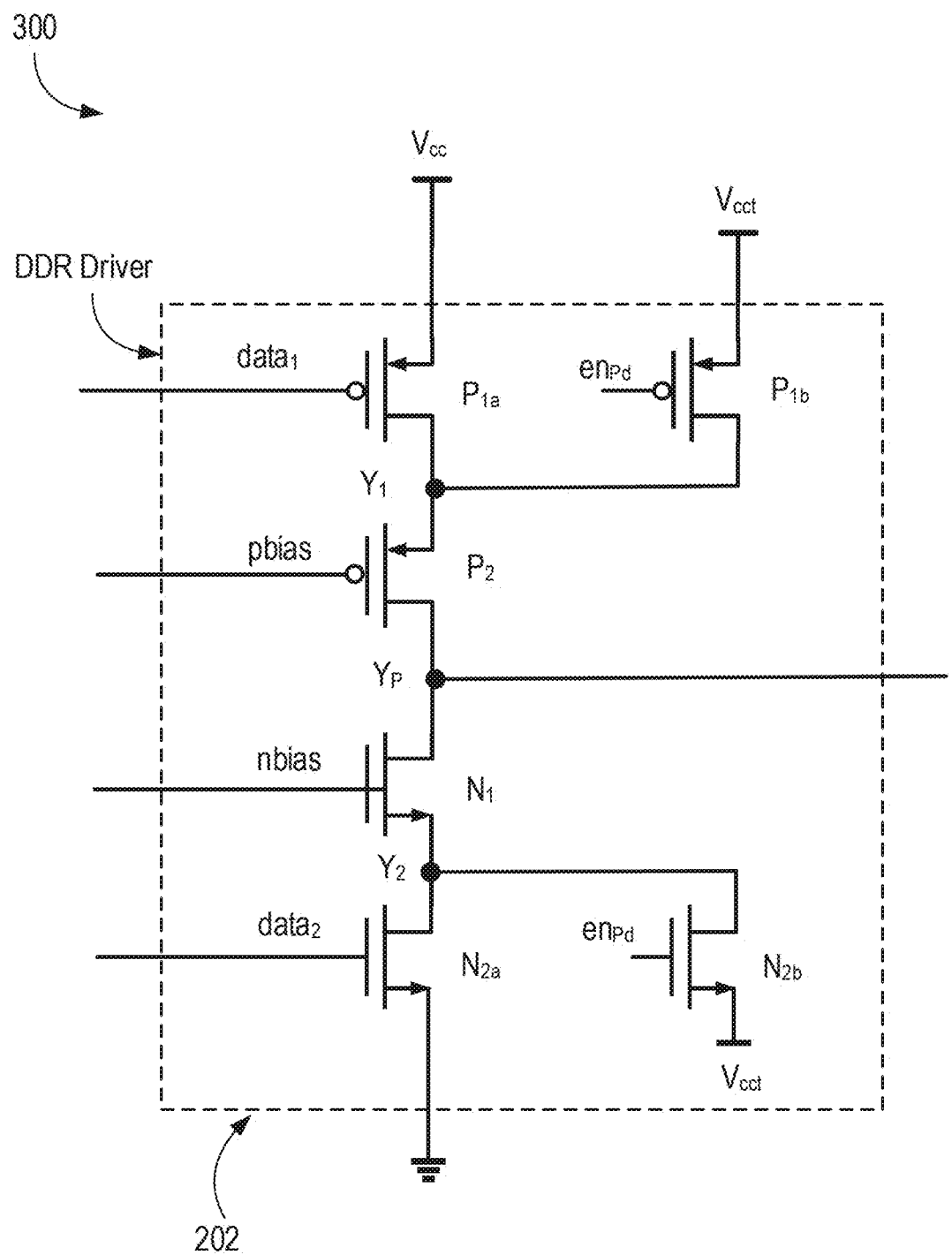
FIG. 3 illustrates a schematic of a Double Data Rate (DDR) driver circuitry, according to some embodiments of the disclosure.

FIG. 3 illustrates a schematic of a DDR driver circuitry 300, according to some embodiments. In some embodiments, the DDR driver circuitry 300 corresponds to the DDR driver circuitry 202 of FIG. 2. In some embodiments, the DDR driver circuitry 300 comprises a first stack of transistors including a first transistor $P_{1a}$ (e.g., a p-type transistor) and a second transistor $P_2$ (e.g., a p-type transistor) coupled in series, and having a first common node $Y_1$. In some embodiments, the first transistor $P_{1a}$ is coupled to the first power supply rail $V_{cc}$. In some embodiments, the DDR driver circuitry 300 comprises a third transistor $P_{1b}$ (e.g., a p-type transistor) coupled to the first common node $Y_1$. In some embodiments, the third transistor $P_{2a}$ is coupled to the second power supply rail $V_{cct}$.

In some embodiments, the DDR driver circuitry 300 comprises a second stack of transistors of an opposite conductivity type to the first stack of transistors. In some embodiments, the second stack of transistors includes: a fourth transistor $N_1$ (e.g., a n-type transistor) and a fifth transistor $N_{2a}$ (e.g., an n-type transistor) coupled in series and having a second common node $Y_2$. In some embodiments, the second stack of transistors is coupled in series to the first stack of transistors and having a third common node $Y_p$. In some embodiments, the second stack of transistors comprises a sixth transistor $N_{2b}$ (e.g., an n-type transistor) coupled to the second common node $Y_2$, wherein the sixth transistor $N_{2b}$ is coupled to the second power supply rail $V_{cct}$.

In some embodiments, a gate terminal of the transistor $P_{1a}$ is coupled to a data input ($data_1$), and a gate terminal of the transistor $P_{2a}$ is coupled to a first bias (pbias); and a gate terminal of the transistor $P_{2a}$ is coupled to an enable input ($en_{Pd}$). In some embodiments, a gate terminal of the transistor $N_1$ is coupled to a second bias (nbias), and a gate terminal of the transistor $N_{2a}$ is coupled to a second data input ($data_2$), and a gate terminal of the third n-type transistor $N_{2b}$ is coupled to an enable input ($en_{Pd}$).

Referring to FIGS. 2-3, in some embodiments, transistors NPu1 and NPu2 of FIG. 2 act as an NMOS pull-up circuitry, e.g., as discussed with respect to FIG. 2. Also, the transistors $N_1$, $N_{2a}$ and $N_{2b}$ of the DDR driver 202 (illustrated in FIG. 3) may act as a pull-down circuitry for the transmitter 200.

Figure 4:
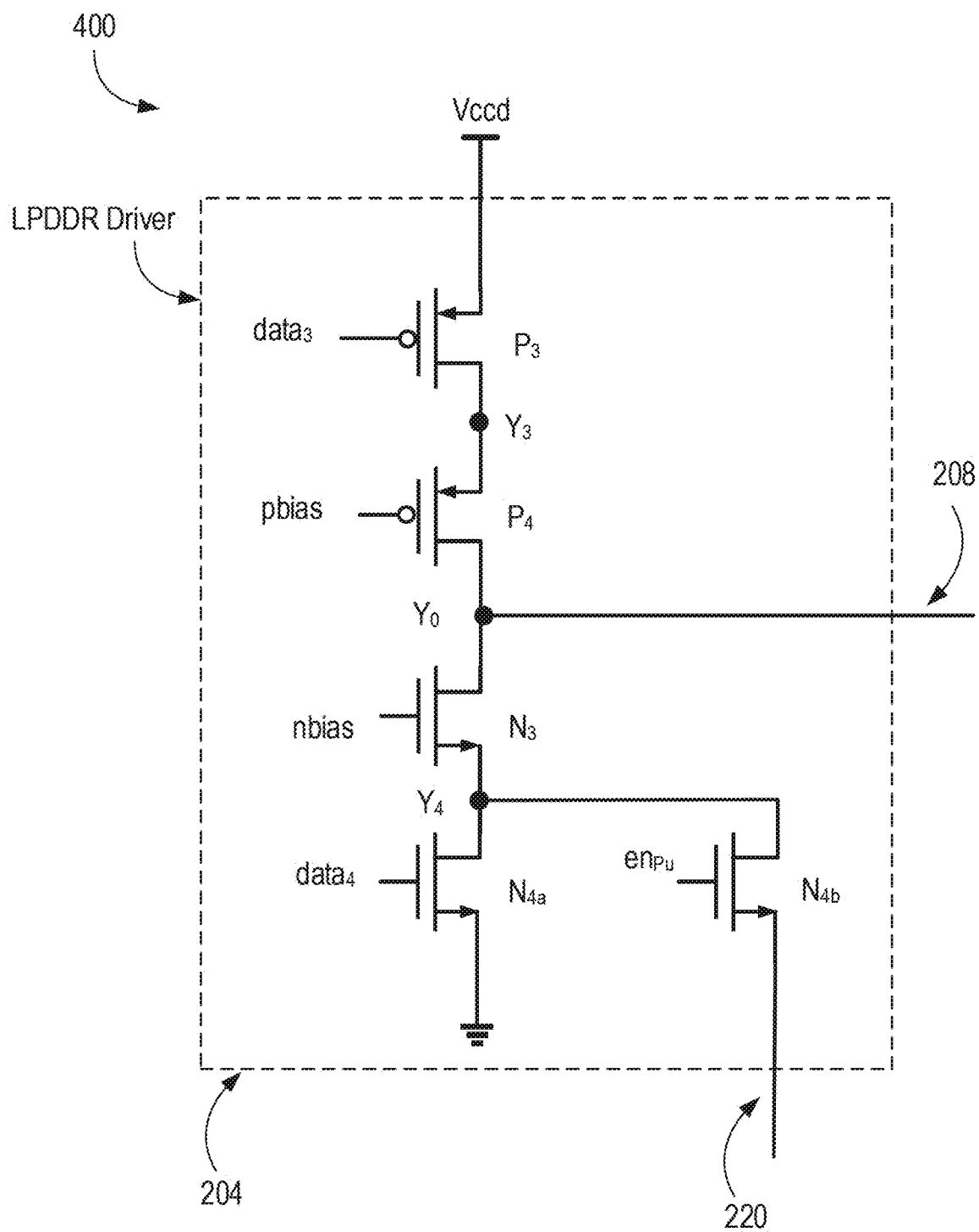
FIG. 4 illustrates a schematic of a Low Power Double Data Rate (LPDDR) driver circuitry, according to some embodiments of the disclosure.

FIG. 4 illustrates a schematic of a LPDDR driver circuitry 400, according to some embodiments. In some embodiments, the LPDDR driver circuitry 400 corresponds to the LPDDR driver circuitry 204 of FIG. 2. In some embodiments, the LPDDR driver circuitry 400 comprises a first stack of transistors including a p-type transistor $P_3$ and a p-type transistor $P_4$ coupled in series and having a first common node $Y_3$. In some embodiments, the p-type transistor $P_3$ is coupled to the third power supply rail $V_{ccd}$.

In some embodiments, the LPDDR driver circuitry 400 comprises a second stack of transistors of an opposite conductivity type compared to the first stack of transistors. In some embodiments, the second stack of transistors includes: an n-type transistor $N_3$ and an n-type transistor $N_{4a}$ coupled in series and having a second common node $Y_4$. In some embodiments, the second stack of transistors is coupled in series to the first stack of transistors and having a third common node $Y_0$. In some embodiments, the second stack of transistors comprises an n type transistor $N_{4b}$ coupled to the second common node $Y_4$. In some embodiments, the n type transistor $N_{4b}$ is coupled to the resistive device 206 via junction 220 (as shown in FIG. 2).

In some embodiments, a gate terminal of the transistor $P_3$ is coupled to a data input ($data_3$), and a gate terminal of the transistor $P_4$ is coupled to a bias (pbias). In some embodiments, a gate terminal of the transistor $N_3$ is coupled to a bias (nbias), and a gate terminal of the transistor $N_4$ is coupled to a data input ($data_4$), and a gate terminal of the transistor $N_{4b}$ is coupled to an enable input ($en_{Pu}$).

Referring to FIGS. 2-4, in some embodiments, the DDR driver 202 (e.g., see FIG. 3) provides a pull-up path using P-type transistors, and also provides a pull-down path using N-type transistors. The LPDDR driver 204 (e.g., see FIG. 3) provides a pull-up path using p-over-n stack of transistors. The NMOS pull-up circuitry (e.g., comprising transistors $NP_{u1}$ and $NP_{u2}$) of FIG. 2 provides a pull-up path using N-type transistors.

The pull-up path to be used may be based on a type of memory with which the combo transmitter driver 200 is being used. For example, for relatively high voltage (e.g., greater than 1.0 V) memory (e.g., such as DDR1, DDR2, DDR3, DDR4, etc.), the pull-up path (e.g., using P-type transistors) and the pull-down path (e.g., using N-type transistors) of the DDR driver 202 may be used. Because P-type transistors are better suited for pull-up drivers when the input voltage is relatively high (e.g., higher than 1.0 V, for reasons discussed in further details herein), the pull-up path using the P-type transistors of the DDR driver 202 may be appropriately used.

On the other hand, for relatively low voltage (e.g., less than 0.7 V) memory (e.g., such as LP4x, LP5, etc.), the NMOS pull-up circuitry (e.g., comprising transistors $NP_{u1}$ and $NP_{u2}$ of FIG. 2) may be used, along with the pull-down path (e.g., using N-type transistors) of the DDR driver 202. Because N-type transistors are better suited for pull-up drivers when the input voltage is relatively low (e.g., higher than 0.7 V, for reasons discussed in further details herein), the pull-up path using the N-type transistors of the NMOS pull-up circuitry of FIG. 2 may be appropriately used.

Thus, the combo transmitter 200 may be used for high voltage memory and/or low voltage memory, and hence, the name "combo" transmitter.

Figure 5:
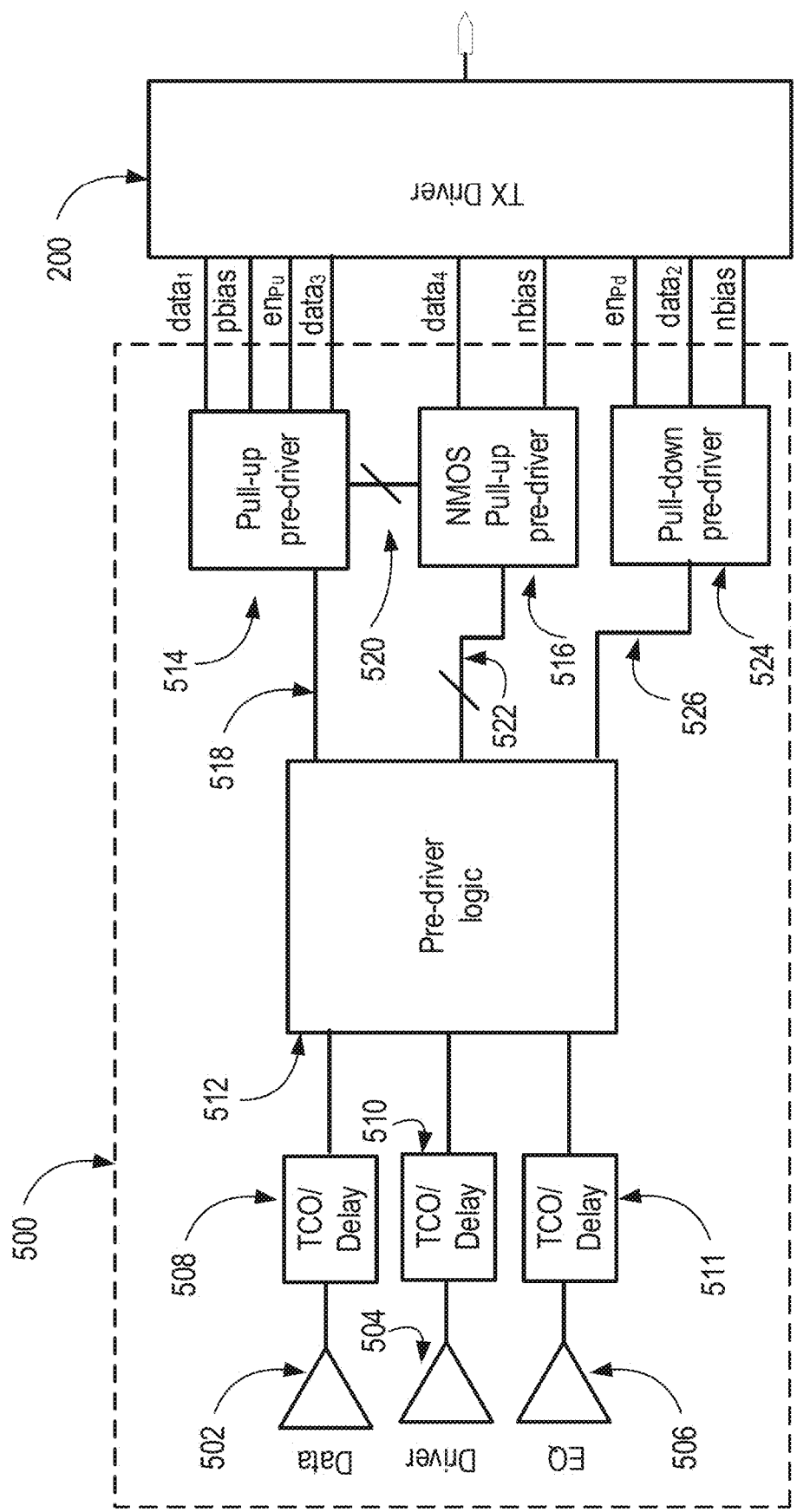
FIG. 5 illustrates a schematic of a pull-up pre-driver, according to some embodiments of the disclosure.

FIG. 5 illustrates a schematic of a common pull pre-driver 500, according to some embodiments. In some embodiments, the common pull pre-driver 500 comprises data input 502, Driver input 504, and Equalizer (EQ) input 506. In some embodiments, the data input 502, Driver input 504, and Equalizer (EQ) input 506 are coupled to Time to Clock Out (TCO)/Delay circuitries 508, 510 and 511, respectively. The common pull pre-driver 500 drives the combo transmitter 200 of FIGS. 2-4.

In some embodiments, since the combo transmitter driver 200 has both P and N Pull-up paths, a common pull-up pre-driver is used to support both paths. Pull-up pre-driver 514 is designed in both High Voltage (HV) and Low Voltage (LV) power supply domains and there are three outputs for each bit in the pull-up pre-driver.

The pull-up pre-driver 514 outputs include: $data_1$ output corresponding to data input $data_1$ of FIG. 3); pbias output corresponding to pbias input of FIG. 3 and FIG. 4, $en_{P_u}$ output corresponding to $en_{P_u}$ input of FIG. 2 and FIG.), and a $data_3$ output corresponding to data input $data_3$ of FIG. 4). PMOS pull-up pre-driver (514) is driven by the level shifted P_pup gated data from pre-driver logic (512) output (518). NMOS pull-up pre-driver (516) is driven by two outputs HV and LV (520) from pull-up pre-driver to drive the final full-swing inverter. These outputs are generated from N_pup gated data from pre-driver logic out (522) and both LV and HV outputs go through the level shifter to match delay between these outputs. The NMOS pull-up pre-driver 516 outputs include: $data_4$ output corresponding to data input $data_4$ of FIG. 4; and nbias output corresponding to nbias input of FIG. 4. The gated data (both p_up and n_up) from the pre-driver logic out are combined with impedance compensation (RCOMP) code before getting applied to the driver. In addition, there is custom logic in the pre-driver to perform different functionalities, such as Equalizer (EQ) functionality. RCOMP code enables to compensate for process, temperature, and/or voltage variations in the termination impedance. Generally, a duplicate I/O buffer with a termination impedance is compared with a reference impedance to generate the RCOMP code. This RCOMP code is then supplied to other I/Os to bring their termination impedance characteristics to be similar to those of the duplicate I/O buffer.

In an example, since there is common NMOS Pull-down in the DDR driver 202 (e.g., as shown in FIG. 3), there may not be a difference in the pull-down pre-driver to support both DDR4 and LP4x/LP5 technologies. In some embodiments, the pull-down pre-driver (524) is coupled to the Pre-driver logic 512 via link 526, and is designed in the LV power supply domain and the purpose of it is to feed the data to the gate of the NMOS pull-down driver. The NMOS pull-down pre-driver 524 outputs include: $data_2$ output corresponding to data input $data_2$ of FIG. 3; nbias output corresponding to nbias input of FIG. 3; and $en_{P_d}$ output corresponding to $en_{P_d}$ input of FIG. 3. In some embodiments, to match the delay between the pull-up and pull-down pre-drivers, buffers are added in the pull-down pre-driver 524. In some embodiments, if there is some variation in delay across PVT (process, voltage, and temperature) between the pull-up and pull-down electrical paths (which could cause duty cycle issues), e.g., during the post-Si, the Time-to-Clock output (TCO) training along with raised ground supply (Vsshi) is utilized to fix any mismatch. Vsshi (High Ground/VSS) is used to protect PFET devices from overstress by elevating the gate voltage to ground (e.g., elevating the Vgs by +200 mV). In some embodiments, the gated data from pre-driver logic out are combined with the RCOMP code before getting applied to the TX driver. Some other embodiments comprise custom logic in the pre-driver to perform different functionalities, such as Equalizer (EQ) functionality.

Figure 6:
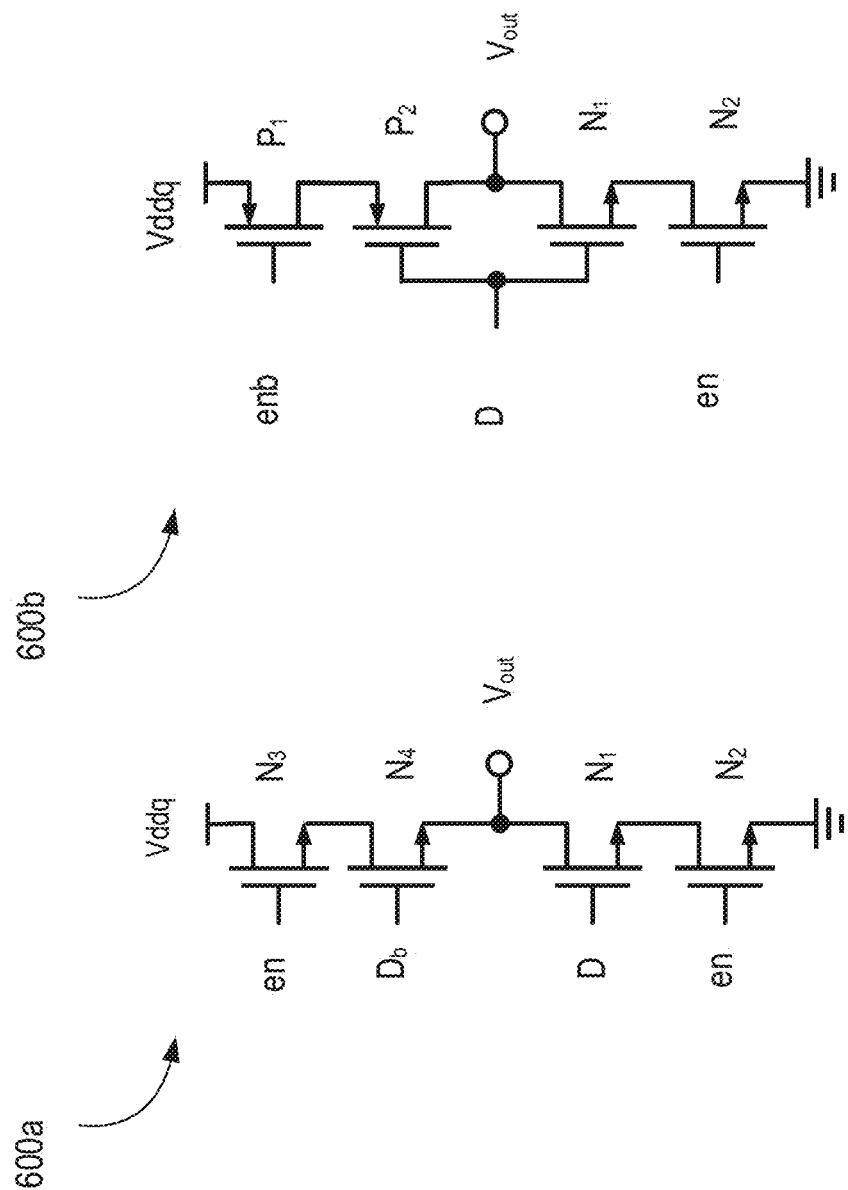
FIGS. 6A-6B illustrate two different conventional transmitter output stage topologies.

FIGS. 6A-6B illustrate two different transmitter output stage topologies. FIG. 6A illustrates a n-over-n topology 600a. The output stage comprises two N-type transistor $N_1$ and $N_4$ and two n-type cascode transistors $N_2$ and $N_3$. FIG. 6B illustrates a p-over-n topology (600b), comprising of two input signal transistors $N_1$ and $P_2$ and two cascode transistors $P_1$ and $N_2$.

The n-over-n transmit output stage of FIG. 6A uses increased predriver and driver supply voltages, when it is to provide higher output swing. The n-over-n topology also offers linearity and output voltage swing at low supply voltages (e.g., 0.3-0.4V), but suffers from maximum swing issue at higher supply voltages (e.g., 0.6-0.7V or higher). To increase the output swing in the n-over-n topology, the pre-driver supply voltage and output stage supply voltage are increased simultaneously, resulting in increased power dissipation in the pre-driver stage.

The p-over-n topology of FIG. 6B offers an alternative to n-over-n, but is limited by the pull-up slew rate. In some embodiments, a pn-over-n topology (discussed with respect to FIG. 7 herein below) addresses both the limited output swing issue with the n-over-n and the poor slew rate issue with the p-over-n topology by employing a p and n device combination in the pull-up driver branch.

Figure 7:
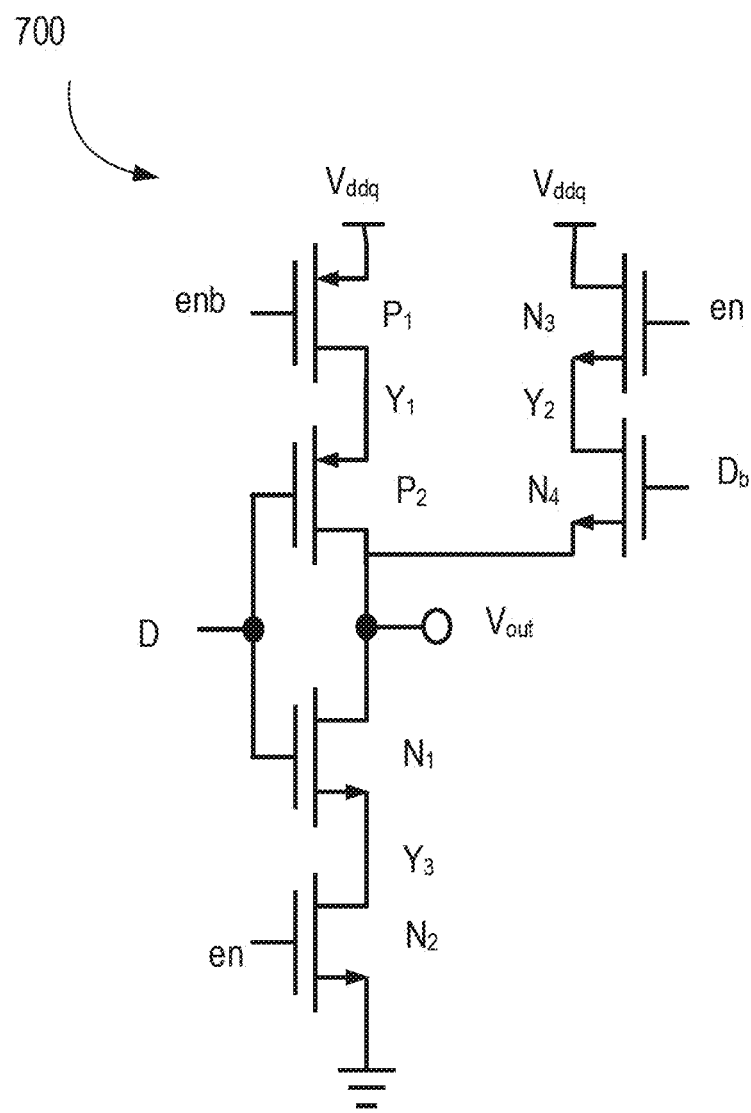
FIG. 7 illustrates a pn-over-n transmitter output stage according to some embodiments.

FIG. 7 illustrates a pn-over-n transmitter output stage 700, according to some embodiments. In some embodiments, the pn-over-n topology of FIG. 7 addresses both the limited output swing issue with n-over-n and poor slew rate issue with p-over-n topology by employing a p+n device combination in the pull-up branch.

In some embodiments, the pn-over-n transmitter output stage 700 comprises a first stack of transistors including a first p-type transistor $P_1$ and a second p-type transistor $P_2$ coupled in series and having a first common node $Y_1$. In some embodiments, the first p-type transistor $P_1$ is coupled to a power supply rail $V_{ddq}$. In some embodiments, the first stack of transistors is coupled to a second stack of transistors of an opposite conductivity type to the first stack of transistors. In some embodiments, the second stack of transistors comprises a third p-type transistor $N_3$ and a fourth n-type transistor $N_4$ coupled in series and having a second common node $Y_2$. In some embodiment, the n-type transistor $N_3$ is coupled to the power supply rail $V_{ddq}$.

In some embodiments, the pn-over-n transmitter output stage 700 comprises a third stack of transistors of an opposite conductivity type coupled to the first stack of transistors. In some embodiments, the third stack of transistors includes: a fifth n-type transistor $N_1$ and a sixth n-type transistor $N_2$ coupled in series and having a third common node $Y_3$. In some embodiments, the third stack of transistors is coupled in series to the first stack of transistors and having a fourth common node $V_{out}$, and a fifth common node D. In some embodiments the first stack of transistors comprises a p-type transistor.

In some embodiments, a gate terminal of the first p-type transistor $P_1$ is coupled to a first enable input (enb), and a gate terminal of the second p-type transistor $P_2$ is coupled to a first input data (D), and a gate terminal of the third n-type transistor $N_3$ is coupled to a second enable input (en), and a gate terminal of the fourth n-type transistor $N_4$ is coupled to a second input data ($D_b$). In some embodiments, a gate terminal of the fifth n-type transistor $N_1$ is coupled to the input data (D), and a gate terminal of the sixth n-type transistor $N_2$ is coupled to the second enable input (en).

Referring to FIGS. 6A, 6B, and 7, the pn-over-n transmitter output stage 700 of FIG. 7 is a combination of the n-over-n topology 600a of FIG. 6A and the p-over-n topology of FIG. 6B. In some embodiments, sections of the pn-over-n transmitter output stage 700 of FIG. 7 are selectively activated, e.g., based on a desired output voltage swing and a voltage level of the supply voltage.

For example, if a relatively low output voltage swing is desired and the supply voltage is relatively low, the output stage 700 is operated in a n-over-n topology (e.g., by activating and using transistors N1, N2, N3, and N4). Thus, from operational stand-point, the output stage 700 becomes similar to the n-over-n topology of FIG. 6A, and provides linearity and output voltage swing at relatively low supply voltages (e.g., 0.3-0.4V, less than 0.7 V, etc.).

On the other hand, for example, if a relatively high output voltage swing is desired and/or if the supply voltage is higher (e.g., 0.7 or higher), the output stage 700 is operated in a p-over-n topology (e.g., by activating and using transistors P1, P2, N1, and N2). Thus, from operational stand-point, the output stage 700 becomes similar to the p-over-n topology of FIG. 6B, and offers the higher voltage swing.

In yet another example, irrespective of the supply voltage (or at least for some supply voltage), both the pull-up paths (e.g., a first pull-up path comprising the P-type transistors P1, P2, and a second pull-up path comprising the N-type transistors N1, N2) of the output stage 700 may be operational, which provides the combined benefits of FIGS. 6A and 6B.

Figure 8A:
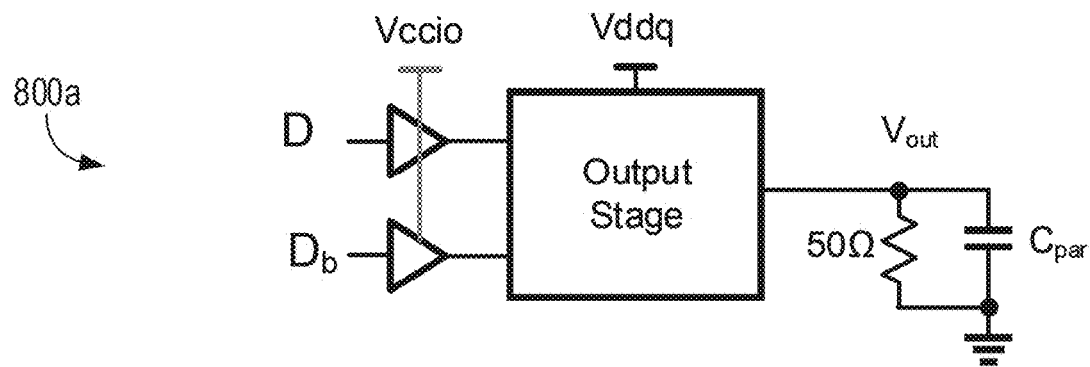
FIG. 8A illustrates a test setup for testing different output stage topologies.
Figure 8B:
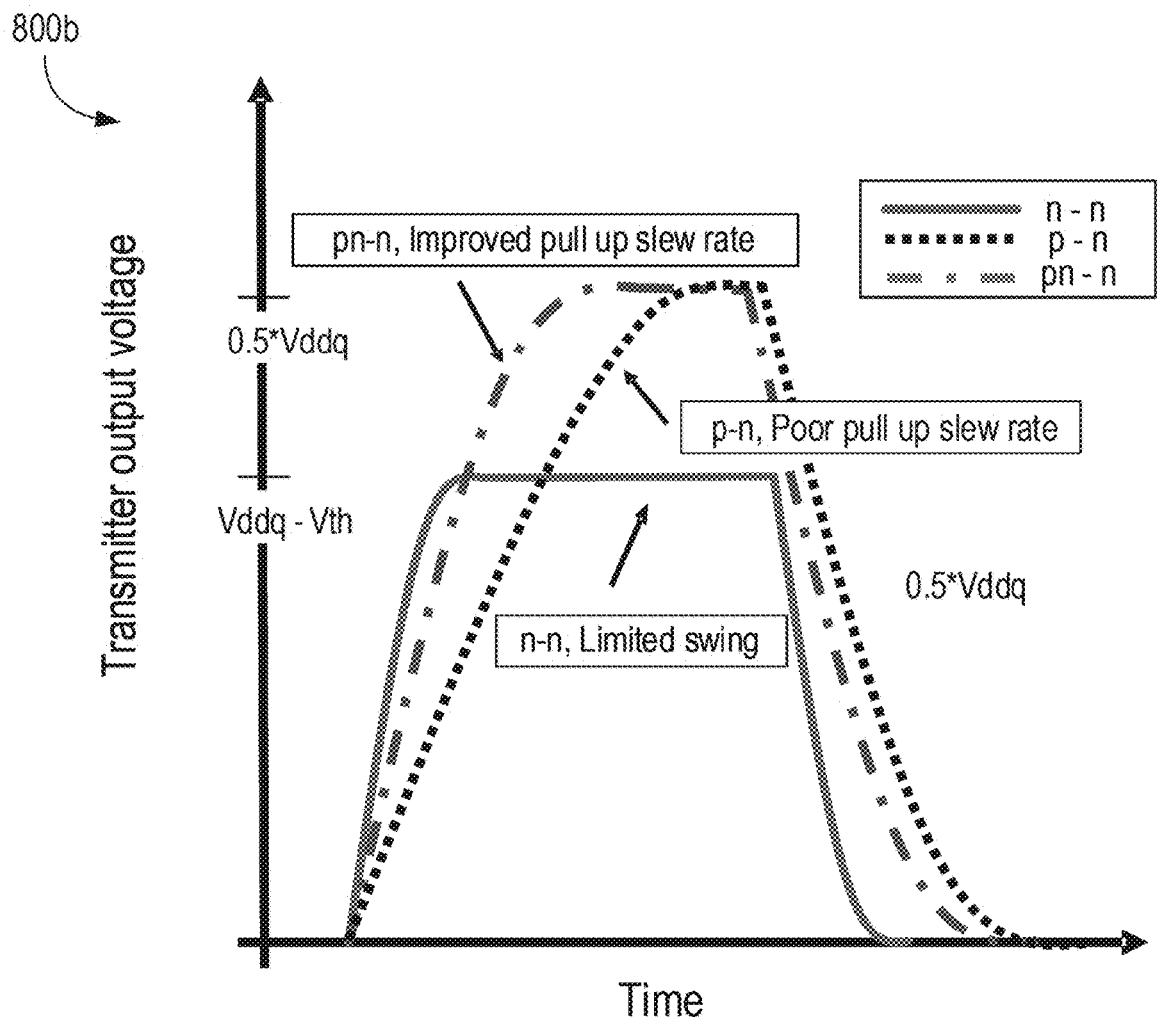
FIG. 8B illustrates a pulse response output for n-n, p-n and pn-n topologies.

FIG. 8A illustrates a test setup 800a for testing different output stage topologies. The set up 800a is used to test the pulse response of the three different output stage topologies: n-n (600a), p-n (600b) and pn-n (700). FIG. 8B illustrates the pulse response outputs for n-n (600a), p-n (600b) and pn-n (700) topologies. The pulse response (e.g., 6.4 Gb/s with 156.25 ps pulse width) simulation results for the three topologies under iso-loading, iso-supply voltage conditions demonstrates the shortcomings of topologies of n-over-n (n-n) and p-over-n (p-n), and improvements offered by topology pn-over-n (pn-n).

Table 1 compares the performance of each topology based on sensitivity of swing and slew rate from the output stage supply voltage ($V_{ddq}$) perspective.

TABLE 1

| Topology | Swing | Slew rate |
|---|---|---|
| n-over-n of FIG. 6A | Good at lower $V_{ddq}$ Degrades as $V_{ddq}$ increases. It requires an increase in predriver swing to fix the problem. | Good at lower $V_{ddq}$ Degrades as $V_{ddq}$ increases making it less preferred at higher $V_{ddq}$ |
| p-over-n of FIG. 6B | Degrades at lower $V_{ddq}$ Good when $V_{ddq} > 2$ Vt, where Vt is the threshold voltage of the transistor | Degrades as $V_{ddq}$ decreases making it less preferred |
| pn-over-n of FIG. 7 | Offers benefits of both n-over-n and p-over-n Good across wide $V_{ddq}$ range (by switching configuration to n-over-n at low $V_{ddq}$) | Offers benefits of both n-over-n and p-over-n Good across $V_{ddq}$ |

Figure 9A:
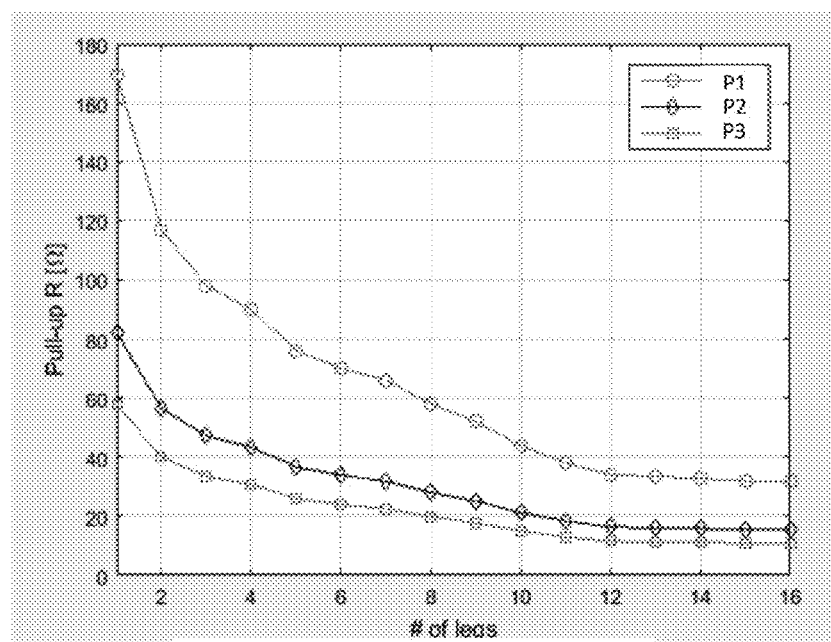
FIGS. 9A and 9B illustrate a post-layout simulation result of the pull-up and pull-down impedances of the output stage across three process corners, according to some embodiments.
Figure 9B:
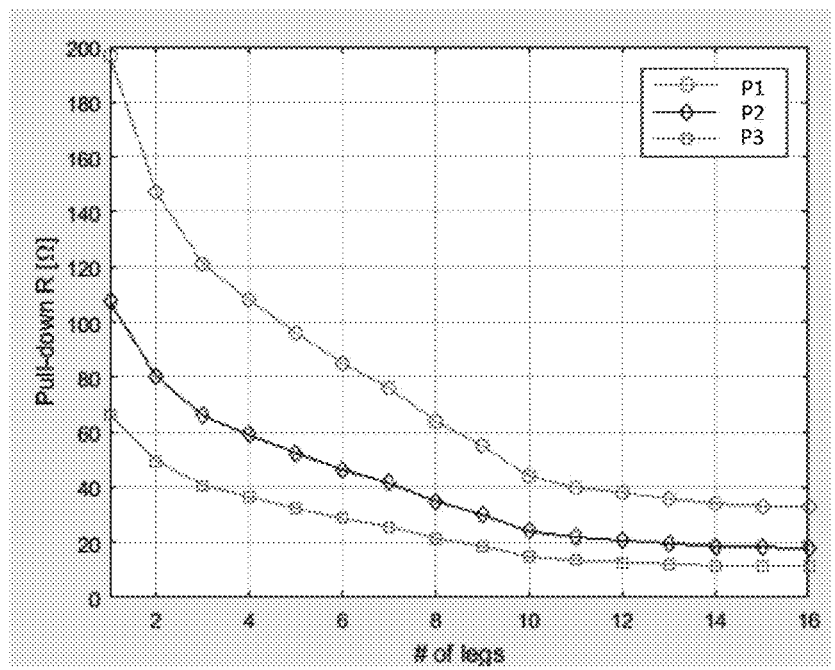

FIG. 9 illustrates post-layout simulation result of the pull-up (FIG. 9A) and pull-down (FIG. 9B) impedances of the output stage, implemented as a function of different number of legs (1-16) across three process corners (P1, P2, and P3), according to some embodiments. In memory cells, the PVT (process, voltage, and temperature) control circuit consists on a PVT sensor block. The PVT control circuit is used to track the PVT conditions, and output driver block, which is split on several legs that are used for the adjustment of output driver impedance according to the detected PVT condition. The results demonstrate the capability of the output stage to be tuned to a target 50Ω impedance accounting for PVT variations, without having to use device and resistor implementations. Implementing the output stage as device-only configuration reduces the pad parasitic capacitance, for example, by approximately 30%, thereby improving the bandwidth of the output node allowing scalability of the interface, for example, up to 10 Gb/s data rates.

Figure 10:
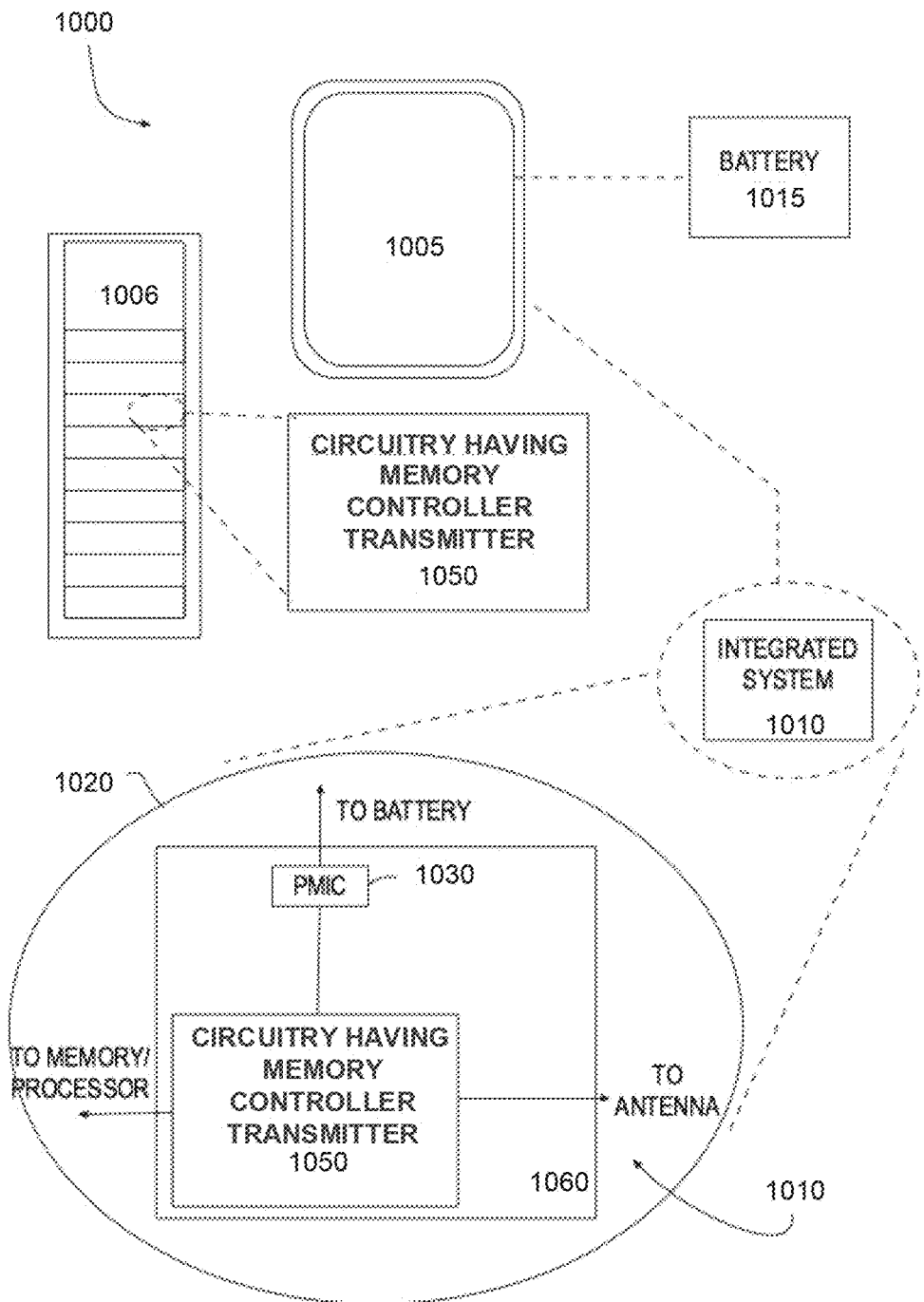
FIG. 10 illustrates a mobile computing platform and a data server machine employing the memory controller transmitter, in accordance with some embodiments.

FIG. 10 illustrates a system 1000 in which a mobile computing platform 1005 and/or a data server machine 1006 employs circuitry including at least one memory controller transmitter, for example in accordance with some embodiments described elsewhere herein. In some embodiments, the mobile computing platform 1005 and/or a data server machine 1006 may comprise transmitter 200 or combo transmitter 200, as discussed with respect to FIGS. 2-9. The server machine 1006 may be any commercial server, for example including any number of high-performance computing platforms disposed within a rack and networked together for electronic data processing, which in the exemplary embodiment includes a circuitry 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level or package-level integrated system 1010, and a battery 1015.

Whether disposed within the integrated system 1010 illustrated in the expanded view 1020, or as a stand-alone discrete or packaged multi-chip module within the server machine 1006, the circuit includes at least one memory controller transmitter, for example in accordance with some embodiments described elsewhere herein. Circuitry 1050 may be further attached to a board, a substrate, or an interposer 1060 along with a power management integrated circuit (PMIC). Functionally, PMIC 1030 may perform battery power regulation, DC-to-DC conversion, etc., and so has an input coupled to battery 1015 and with an output providing a current supply to other functional modules.

Circuitry 1050, in some embodiments, includes RF (wireless) integrated circuitry (RFIC) further including a wideband RF (wireless) transmitter and/or receiver (TX/RX including a digital baseband and an analog front end module comprising a power amplifier on a transmit path and a low noise amplifier on a receive path). The RFIC includes at least one memory controller transmitter device, for example in a memory controller transmitter circuit as describe elsewhere herein. The RFIC has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided in examples below.

Figure 11:
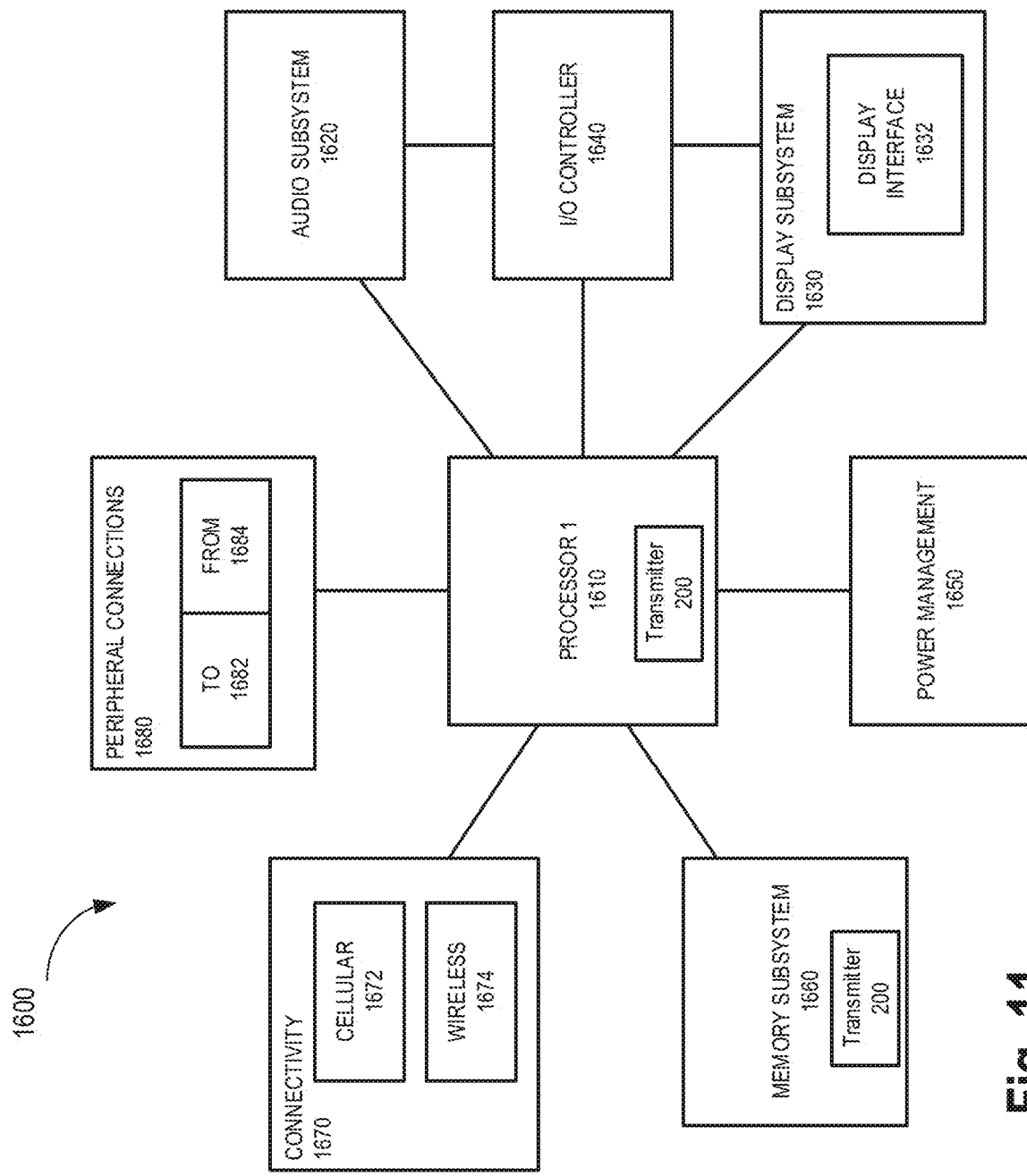
FIG. 11 illustrates a smart device or a computer system or a SoC (System-on-Chip) employing the memory controller transmitter, according to some embodiments of the disclosure.

FIG. 11 illustrates a smart device or a computer system or a SoC (System-on-Chip) employing a dual power transmitter, according to some embodiments of the disclosure. It is pointed out that those elements of FIG. 11 having the same reference numbers (or names) as the elements of any other figure can operate or function in any manner similar to that described, but are not limited to such.

FIG. 11 illustrates a block diagram of an embodiment of a computing device in which a dual power transmitter could be used, according to some embodiments. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with a memory controller transmitter, according to some embodiments discussed. Other blocks of the computing device 1600 may also include transmitter 200, combo transmitter 200, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

In one example, an apparatus is provided comprising: a first power supply rail to provide a first power supply; second and a third power supply rails to provide second and third power supplies, respectively, wherein a voltage level of the first power supply is higher than a voltage level of the second and third power supplies; a first driver circuitry coupled to the first and second power supply rail; a second driver circuitry coupled to the third power supply rail, and coupled to the first driver circuitry; and a stack of transistors of N conductivity type coupled to the first power supply rail, and the second driver circuitry.

Example 2

The apparatus of Example 1, wherein the first driver circuitry comprises: a first stack of transistors of a P conductivity type comprising: a first transistor and a second transistor coupled in series and with a first common node, wherein the first transistor is coupled to the first power supply rail; and a third transistor coupled to the first common node, wherein the third transistor is coupled to the second power supply rail; and a second stack of transistors of an N conductivity type coupled to the first stack of transistors, wherein the second stack of transistors comprises: a fourth transistor and a fifth transistor coupled in series and with a second common node, wherein the second stack of transistors is coupled in series to the first stack of transistors and wherein the first and second stack of transistors have a third common node that is coupled to the second driver circuitry; and a sixth transistor coupled to the second common node, wherein the sixth transistor is coupled to the second power supply rail.

Example 3

The apparatus of Examples 1-2, wherein the second driver circuitry comprises: a third stack of transistors of the P conductivity type including a seventh transistor and an eight transistor coupled in series and with a fourth common node, wherein the seventh transistor is coupled to the third power supply rail; and a fourth stack of transistors of the N conductivity type coupled to the third stack of transistors, wherein the fourth stack of transistors comprises: a ninth transistor and a tenth transistor coupled in series and with a fifth common node, wherein the fourth stack of transistors is coupled in series to the third stack of transistors and has a sixth common node; and an eleventh transistor coupled to the sixth common node, wherein the eleventh transistor is coupled to a resistive device.

Example 4

The apparatus of Examples 1-3, wherein: a gate terminal of the first transistor is coupled to a data input; a gate terminal of the second transistor is coupled to a bias; and a gate terminal of the third transistor is coupled to an enable input.

Example 5

The apparatus of Examples 1-4, wherein: a gate terminal of the fourth transistor is coupled to a bias; a gate terminal of the fifth transistor is coupled to a data input; and a gate terminal of the third transistor is coupled to an enable input.

Example 6

The apparatus of Examples 1-5, wherein a gate terminal of the seventh transistor is coupled to a data input; and wherein a gate terminal of the eighth transistor is coupled to a bias.

Example 7

The apparatus of Examples 1-6, wherein a gate terminal of the ninth transistor is coupled to a data input; a gate terminal of the tenth transistor is coupled to a bias; and a gate terminal of the eleventh transistor is coupled to an enable input.

Example 8

The apparatus of Examples 1-7, wherein the first stack of transistors comprises a p-type transistor.

Example 9

The apparatus of Examples 1-8, wherein the third stack of transistors comprises a p-type transistor.

Example 10

The apparatus of Examples 1-9, wherein the stack of transistors of N conductivity type are coupled to the first driver circuitry via the resistive device.

Example 11

The apparatus of Examples 1-10, wherein the first driver circuitry comprises a DDR driver circuitry, and the second driver circuitry comprises a LPDDR driver circuitry.

Example 12

In one example, a system is provided comprising: a memory to store instructions; a processor coupled to the memory and to execute the instructions, the processor comprising: a first power supply rail to provide a first power supply; second and a third power supply rails to provide second and third power supplies, respectively, wherein a voltage level of the first power supply is higher than a voltage level of the second and third power supplies; a first driver circuitry coupled to the first and second power supply rail; a second driver circuitry coupled to the third power supply rail, and coupled to the first driver circuitry; and a stack of transistors of N conductivity type coupled to the first power supply rail, and the second driver circuitry; and a wireless interface to allow the processor to communicate with another system.

Example 13

The system of Example 12, wherein the first driver circuitry comprises: a first stack of transistors of a P conductivity type comprising: a first transistor and a second transistor coupled in series and with a first common node, wherein the first transistor is coupled to the first power supply rail; and a third transistor coupled to the first common node, wherein the third transistor is coupled to the second power supply rail; and a second stack of transistors of an N conductivity type coupled to the first stack of transistors, wherein the second stack of transistors comprises: a fourth transistor and a fifth transistor coupled in series and with a second common node, wherein the second stack of transistors is coupled in series to the first stack of transistors and wherein the first and second stack of transistors have a third common node that is coupled to the second driver circuitry; and a sixth transistor coupled to the second common node, wherein the sixth transistor is coupled to the second power supply rail.

Example 14

The system of Examples 12-13, wherein the second driver circuitry comprises: a third stack of transistors of the P conductivity type including a seventh transistor and an eight transistor coupled in series and with a fourth common node, wherein the seventh transistor is coupled to the third power supply rail; and a fourth stack of transistors of the N conductivity type coupled to the third stack of transistors, wherein the fourth stack of transistors comprises: a ninth transistor and a tenth transistor coupled in series and with a fifth common node, wherein the fourth stack of transistors is coupled in series to the third stack of transistors and has a sixth common node; and an eleventh transistor coupled to the sixth common node, wherein the eleventh transistor is coupled to a resistive device.

Example 15

The system of Examples 12-14, wherein: a gate terminal of the first transistor is coupled to a data input; a gate terminal of the second transistor is coupled to a bias; and a gate terminal of the third transistor is coupled to an enable input.

Example 16

The system of Examples 12-15, wherein: a gate terminal of the fourth transistor is coupled to a bias; a gate terminal of the fifth transistor is coupled to a data input; and a gate terminal of the third transistor is coupled to an enable input.

Example 17

The system of Examples 12-16, wherein a gate terminal of the seventh transistor is coupled to a data input; and wherein a gate terminal of the eighth transistor is coupled to a bias.

Example 18

The system of Examples 12-17, wherein a gate terminal of the ninth transistor is coupled to a data input; a gate terminal of the tenth transistor is coupled to a bias; and a gate terminal of the eleventh transistor is coupled to an enable input.

Example 19

The system of Examples 12-18, wherein the stack of transistors of N conductivity type are coupled to the first driver circuitry via the resistive device.

Example 20

The system of Examples 12-19, wherein the first driver circuitry comprises a DDR driver circuitry, and the second driver circuitry comprises a LPDDR driver circuitry.

Example 21

In one example, an apparatus is provided comprising: a power supply rail to provide a power supply; a first stack of transistors including: a first transistor and a second transistor coupled in series and having a first common node, wherein the first transistor is coupled to the first power supply rail; and a second stack of transistors of an opposite conductivity type to the first stack of transistors, wherein the second stack of transistors includes: a third transistor and a fourth transistor coupled in series and with a second common node, wherein the third transistor is coupled to the power supply rail.

Example 22

The apparatus of Example 21, comprising a third stack of transistors of an opposite conductivity type to the first stack of transistors, wherein the third stack of transistors comprises: a fifth transistor and a sixth transistor coupled in series and with a third common node, wherein the third stack of transistors is coupled in series to the first stack of transistors and with fourth and fifth common nodes.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An apparatus comprising:
   a first power supply rail to provide a first power supply;
   second and third power supply rails to provide second and third power supplies, respectively, wherein a voltage level of the first power supply is higher than a voltage level of each of the second and third power supplies, and wherein the voltage level of the first power supply, the voltage level of the second power supply, and the voltage level of the third power supply is greater than zero;
   a first driver circuitry coupled to the first power supply rail and the second power supply rail;
   a second driver circuitry coupled to the third power supply rail, and coupled to the first driver circuitry; and
   a stack of transistors of N conductivity type coupled to the first power supply rail, and to the second driver circuitry.

2. The apparatus of claim 1, wherein the first driver circuitry comprises:
   a first stack of transistors of a P conductivity type comprising:
      a first transistor and a second transistor coupled in series and with a first common node, wherein the first transistor is coupled to the first power supply rail; and
      a third transistor coupled to the first common node, wherein the third transistor is coupled to the second power supply rail; and
   a second stack of transistors of an N conductivity type coupled to the first stack of transistors, wherein the second stack of transistors comprises:
      a fourth transistor and a fifth transistor coupled in series and with a second common node, wherein the second stack of transistors is coupled in series to the first stack of transistors, and wherein the first and second stack of transistors have a third common node that is coupled to the second driver circuitry; and
      a sixth transistor coupled to the second common node, wherein the sixth transistor is coupled to the second power supply rail.

3. The apparatus of claim 2, wherein the second driver circuitry comprises:
   a third stack of transistors of the P conductivity type comprising a seventh transistor and an eighth transistor coupled in series and with a fourth common node, wherein the seventh transistor is coupled to the third power supply rail; and
   a fourth stack of transistors of the N conductivity type coupled to the third stack of transistors, wherein the fourth stack of transistors comprises:
      a ninth transistor and a tenth transistor coupled in series and with a fifth common node, wherein the fourth stack of transistors is coupled in series to the third stack of transistors and has a sixth common node; and
      an eleventh transistor coupled to the sixth common node, wherein the eleventh transistor is coupled to a resistive device.

4. The apparatus of claim 2, wherein:
a gate terminal of the first transistor is coupled to a data input;
a gate terminal of the second transistor is coupled to a bias; and
a gate terminal of the third transistor is coupled to an enable input.

5. The apparatus of claim 2, wherein:
a gate terminal of the fourth transistor is coupled to a bias;
a gate terminal of the fifth transistor is coupled to a data input; and
a gate terminal of the third transistor is coupled to an enable input.

6. The apparatus of claim 3, wherein:
a gate terminal of the seventh transistor is coupled to a data input; and
a gate terminal of the eighth transistor is coupled to a bias.

7. The apparatus of claim 3, wherein:
a gate terminal of the ninth transistor is coupled to a data input;
a gate terminal of the tenth transistor is coupled to a bias; and
a gate terminal of the eleventh transistor is coupled to an enable input.

8. The apparatus of claim 2, wherein the first stack of transistors comprises a p-type transistor.

9. The apparatus of claim 3, wherein the third stack of transistors comprises a p-type transistor.

10. The apparatus of claim 1, wherein the stack of transistors of N conductivity type and the second driver circuitry are coupled to the first driver circuitry via a resistive device.

11. The apparatus of claim 1, wherein the first driver circuitry comprises a DDR driver circuitry, and wherein the second driver circuitry comprises a LPDDR driver circuitry.

12. A system comprising:
a memory to store instructions;
a processor coupled to the memory and to execute the instructions, the processor comprising:
a first power supply rail to provide a first power supply;
second and third power supply rails to provide second and third power supplies, respectively, wherein the first power supply is higher than the second and third power supplies;
a first driver circuitry coupled to the first and second power supply rail;
a second driver circuitry coupled to the third power supply rail, and coupled to the first circuitry via a resistive device; and
a stack of transistors of a N conductivity type coupled to the first power supply rail, and the driver circuitry; and
a wireless interface to allow the processor to communicate with another system.

13. The system of claim 12, wherein the driver circuitry comprises:
a first stack of transistors of a P conductivity type comprising:
a first transistor and a second transistor coupled in series and with a first common node, wherein the first transistor is coupled to the first power supply rail; and
a third transistor coupled to the first common node, wherein the third transistor is coupled to the second power supply rail; and
a second stack of transistors of a N conductivity type coupled to the first stack of transistors, wherein the second stack of transistors comprises:
a fourth transistor and a fifth transistor coupled in series and with a second common node, wherein the second stack of transistors is coupled in series to the first stack of transistors and having a third common node; and
a sixth transistor coupled to the second common node, wherein the sixth transistor is coupled to the second power supply rail.

14. The system of claim 12, wherein the second driver circuitry comprises:
a third stack of transistors of P conductivity type comprising a seventh transistor and an eighth transistor coupled in series and with a fourth common node, wherein the seventh transistor is coupled to the third power supply rail; and
a fourth stack of transistors of the N conductivity type coupled to the third stack of transistors, wherein the fourth stack of transistors comprises:
a ninth transistor and a tenth transistor coupled in series and having a fifth common node, wherein the fourth stack of transistors is coupled in series to the third stack of transistors and with a sixth common node; and
an eleventh transistor coupled to the sixth common node, wherein the eleventh transistor is coupled to the resistive device.

15. The system of claim 13, wherein:
a gate terminal of the first transistor is coupled to a data input;
a gate terminal of the second transistor is coupled to a bias; and
wherein a gate terminal of the third transistor is coupled to an enable input.

16. The system of claim 13, wherein:
a gate terminal of the fourth transistor is coupled to a bias;
a gate terminal of the fifth transistor is coupled to a data input; and
a gate terminal of the third transistor is coupled to an enable input.

17. The system of claim 14, wherein:
a gate terminal of the seventh transistor is coupled to a data input; and
a gate terminal of the eighth transistor is coupled to a bias.

18. The system of claim 14, wherein:
a gate terminal of the ninth transistor is coupled to a data input;
a gate terminal of the tenth transistor is coupled to a bias; and
a gate terminal of the eleventh transistor is coupled to an enable input.

* * * * *